United States Patent
Mizuno et al.

(10) Patent No.: US 7,446,406 B2
(45) Date of Patent: Nov. 4, 2008

(54) CIRCUIT DEVICE AND MANUFACTURING METHOD THEREOF

(75) Inventors: Takahito Mizuno, Nagoya (JP); Ren Yamamoto, Toyota (JP); Shigeru Wakita, Okegawa (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 200 days.

(21) Appl. No.: 11/388,987

(22) Filed: Mar. 27, 2006

(65) Prior Publication Data

US 2006/0220216 A1    Oct. 5, 2006

(30) Foreign Application Priority Data

Mar. 30, 2005    (JP)    ............................. 2005-098648

(51) Int. Cl.
    *H01L 23/00* (2006.01)
(52) U.S. Cl. .................. 257/703; 257/678; 257/691; 257/E23.098; 257/E25.031; 257/707; 257/730; 257/731
(58) Field of Classification Search ................ 438/106, 438/122; 257/734, 678, 691, 703, 707, 730, 257/731, E23.098, E25.031
    See application file for complete search history.

(56) References Cited

U.S. PATENT DOCUMENTS

| | | | | |
|---|---|---|---|---|
| 4,172,261 A | * | 10/1979 | Tsuzuki et al. | ............... 257/717 |
| 6,166,937 A | * | 12/2000 | Yamamura et al. | ........... 363/141 |
| 6,670,216 B2 | * | 12/2003 | Strauch | ....................... 438/106 |
| 6,798,060 B2 | * | 9/2004 | Strauch | ....................... 257/705 |
| 2002/0112882 A1 | * | 8/2002 | Hirakawa | ................... 174/256 |
| 2003/0112605 A1 | * | 6/2003 | Hable | ......................... 361/728 |

FOREIGN PATENT DOCUMENTS

| | | |
|---|---|---|
| EP | 1 187 198 A2 | 3/2002 |
| EP | 2003-060129 | 2/2003 |
| EP | 1 416 533 A2 | 5/2004 |
| JP | 11-195725 | 7/1999 |
| JP | 11-346037 | 12/1999 |
| JP | 2000-232189 | 8/2000 |
| JP | 2002-009190 | 1/2002 |
| JP | 2002-164461 | 6/2002 |
| JP | 2003-188310 | 7/2003 |

* cited by examiner

*Primary Examiner*—Zandra Smith
*Assistant Examiner*—Telly D Green
(74) *Attorney, Agent, or Firm*—Kenyon & Kenyon LLP

(57) ABSTRACT

A circuit device includes a ceramic substrate, an Al wiring layer provided on the ceramic substrate, and a semiconductor device and a bus bar which are electrically connected to the wiring layer. On part of the wiring layer, a Ni layer is plated. Thus a coated region in which the wiring layer is coated with nickel having solder wetability superior to aluminum and an exposing region in which the wiring layer is exposed as viewed from above the ceramic substrate are provided. The semiconductor device is connected onto the Ni layer within the coated region through solder. The bus bar is ultrasonically bonded to the wiring layer within the exposing region as viewed from above the ceramic substrate. Thus, the circuit device including the semiconductor device and the bus bar that are bonded to the ceramic substrate by sufficient bonding strength and its manufacturing method are provided.

10 Claims, 4 Drawing Sheets

CIRCUIT DEVICE AND MANUFACTURING METHOD THEREOF

BACKGROUND OF THE INVENTION

1. Field of the Invention

The present invention relates to a circuit device in which a semiconductor device and a bus bar are bonded to a ceramic based board, and a manufacturing method thereof, and more particularly to a circuit device including a ceramic substrate, on a surface of which a wiring layer made of aluminum as a major component is formed, and a manufacturing method thereof.

2. Description of Related Art

Heretofore, there is a circuit device in which a plurality of semiconductor devices and bus bars are mounted on a board. An example of such board may include a ceramic substrate having ceramic material as a base body. For example, a board, called "DBA (Direct Bonded Aluminum) board", in which an aluminum (Al) wiring layer is formed on both surfaces of an aluminum nitride (AlN) substrate is used in many cases. In order to bond the semiconductor device and others to the board by soldering, for example, the surface of the Al layer is typically coated with nickel (Ni) plating or other material plating.

In a power module using the above board, however, thermal shock attributable to heat generation of a semiconductor chip may be added to a solder layer during use. Accordingly, the solder layer may be cracked and the board is likely to be warped or broken due to a difference in coefficient of thermal expansion. In Japanese unexamined patent application publication No. 11-346037(1999), on the other hand, it has been proposed to bond a ceramic board to a bus bar part. This publication shows that such configuration can reduce stress resulting from a difference in coefficient of thermal expansion between the bus bar part and the ceramic substrate.

In Japanese unexamined patent application publication No. 2002-9190, a technique has been proposed to bond a metal lead to a metal circuit layer formed on a ceramic substrate by an ultrasonic welding technique. This technique enables the bonding without requiring heating. Accordingly, it is perhaps possible to reduce an influence on a boundary face between ceramics and metal and enhance the bonding reliability. This publication further states that materials of the metal circuit layer and the metal lead preferably include the same metal as a major component and also that a surface of the metal circuit layer may be coated with Ni plating.

However, the above mentioned conventional techniques have the following problems. The technique of the '037 publication needs the ceramic board bonded to the bus bar, thus leading to an increase in the number of parts and a complicated manufacturing process. In addition, a bonded part between the bus bar and the ceramic board may cause a thermal problem as in the above case.

The technique of the '190 publication can adequately avoid such problem that the bonded part is broken by heat, as compared with the case using the thermal bonding technique. Hence, the inventors of the present invention have tried to ultrasonically bond a copper bus bar to a typical DBA board coated with Ni plating. However, it can be hardly said that sufficient bonding property could be obtained. To find a cause thereof, the inventors examined the bonded part by peeling the bus bar from the substrate. As a result thereof, it was found that the bus bar and the substrate were not appropriately bonded to each other at a central portion of the bonded part. The reason thereof will be explained below.

A board 100 of a conventional circuit device subjected to the above inspection has a structure, as shown in FIG. 6, that a wiring layer 12 made of aluminum (Al) is formed on the surface of a ceramic substrate 11 made of AlN and others as main components, and further a Ni layer 13 is plated on the wiring layer 12. A semiconductor device 20 is bonded to the board 100 with solder 21. FIG. 6 shows a state of the board 100 on which the bus bar 30 is yet to be bonded.

Then, an ultrasonic horn 40 is set in contact with the bus bar 30 placed on the board 100 to perform ultrasonic bonding. At this stage, as shown in FIG. 7, the bus bar 30 is vibrated by the ultrasonic horn 40. The Al layer forming the wiring layer 12 of the board 100 is very soft as compared with the Ni layer 13. It was accordingly found that vibration for ultrasonic bonding caused so large deformation of the Al layer that the Ni layer 13 got stuck into the wiring layer 12. Specifically, energy of vibration could not appropriately be transmitted to a contact surface, i.e., the Ni layer 13.

Actually, the bus bar 30 and the board 100 were not appropriately bonded each other within most part of the bonded area as shown in FIG. 7. In the central portion of the bonded area, specifically, the bus bar 30 merely overlapped the Ni layer 13 without being bonded thereto. At an end portion of the bonded area, on the other hand, the Ni layer 13 was broken and pushed away, so that the bus bar 30 was bonded to the Al wiring layer 12. Thus, the actual area of the bonded part was small, which could not provide sufficient bonding strength.

SUMMARY OF THE INVENTION

The present invention has been made in view of the above circumstances and has an object to provide a circuit device in which a semiconductor device and a bus bar bonded to a ceramic board with sufficient bonding strength, and a manufacturing method thereof. Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the purpose of the invention, there is provided a circuit device in which a functional device and an externally leading conductor are mounted, comprising: a substrate; a wiring layer provided on the substrate and electrically connected to the functional device and to the externally leading conductor; and a coating metal layer formed on a part of the wiring layer to provide a coated region in which the wiring layer is coated and an exposing region in which the wiring layer is exposed; wherein the functional device is connected onto the coating metal layer within the coated region, and the externally leading conductor is bonded to a part of the wiring layer within the exposing region.

According to another aspect of the present invention, there is provided A method of manufacturing a circuit device in which a functional device and an externally leading conductor are mounted, the method comprising the steps of: partially forming a coating metal layer onto a wiring layer formed on a substrate, thereby providing a coated region in which the wiring layer is coated and an exposing region in which the wiring layer is exposed; connecting the functional device onto the coating metal layer within the coated region; and bonding the externally leading conductor to a portion of the wiring layer within the exposing region.

According to the present invention, the functional device and the externally leading conductor are electrically connected to the board including a substrate made of ceramics or the like provided with a wiring layer formed thereon. The functional device is connected to the coated region in which the wiring layer is coated with the coating metal layer. On the other hand, the externally leading conductor is directly connected to the wiring layer within the exposing region in which the wiring layer is uncoated with the coating metal layer and thus exposed. Accordingly, an appropriate bonding technique can be selected for each bonding part. For example, as for an Al wiring layer, the externally leading conductor is bonded to the wiring layer by ultrasonic bonding, so that they can be bonded with sufficient bonding strength. Further, as for the coating metal layer made of nickel (Ni), copper (Cu), or other material having solder wetability superior to Al, the functional device is bonded to the coating metal layer by soldering, so that they can be bonded with sufficient bonding strength.

According to the circuit device and its manufacturing method of the present invention, the semiconductor device and the bus bar can be bonded to the ceramic board with sufficient bonding strength.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention.

In the drawings.

DETAILED DESCRIPTION OF THE PREFERRED EMBODIMENTS

A detailed description of a preferred embodiment of the present invention will now be given referring to the accompanying drawings. In the present embodiment, the present invention is applied to a circuit device in which a semiconductor device and a bus bar are bonded to a ceramic board.

Figure 1:
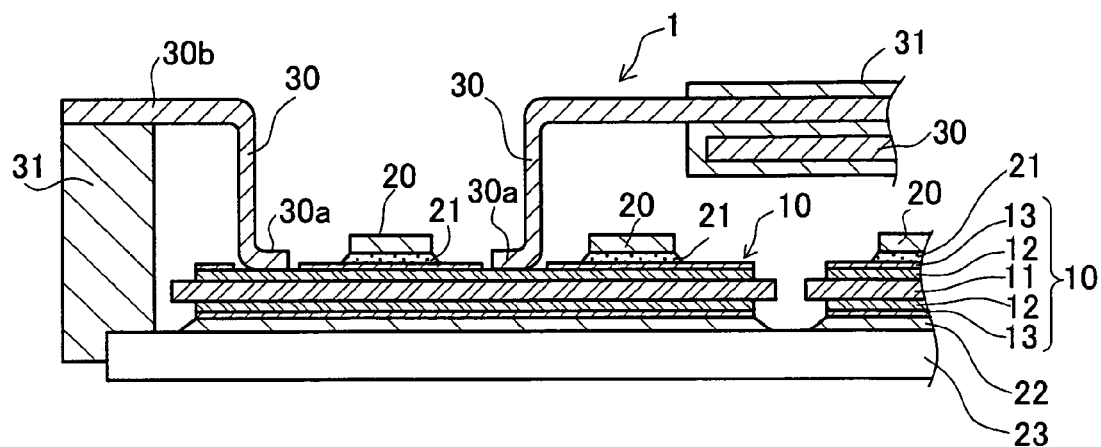
FIG. 1 is a sectional view of part of a circuit device in the present embodiment.
Figure 2:
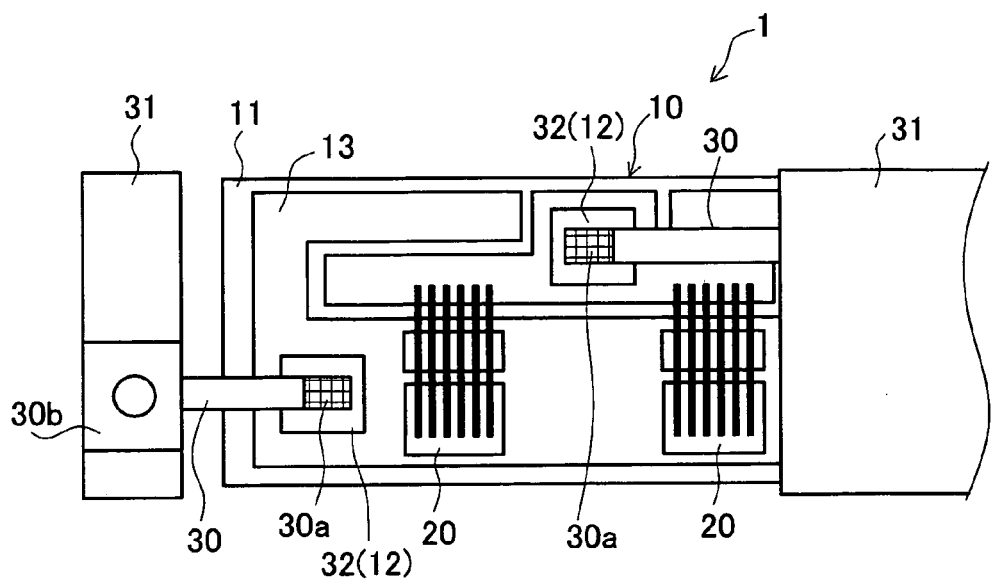
FIG. 2 is a plan view of part of the circuit device.

A circuit device 1 in the present embodiment, as shown in FIG. 1 (a sectional view) and FIG. 2 (a plan view), is structured such that semiconductor devices 20 (IGBT or the like) and bus bars 30 which are bonded to a board 10. This board 10 includes a ceramic substrate 11 made of AlN or the like as a major component, a wiring layer 12 made of Al formed on both surfaces of the ceramic substrate 11, and an Ni layer 13 corresponding to a coating metal layer plated on a surface of the wiring layer 12. As an alternative to the Ni layer 13, a Cu-plated layer may be adopted. On an upper surface (in the figure) of the board 10, the semiconductor device 20 is bonded by solder 21.

The bus bar 30 corresponds to an externally leading conductor, which is formed of a copper plate in bent shape. Only an end portion 30a thereof is bonded to the board 10. A base portion 30b is supported by a housing 31 in spaced relation to the board 10. This arrangement can achieve a smaller area of the board 10 in plan view than conventional one. The housing 31 is fixed to a heat radiation board 23 to maintain its entire strength and shape. Herein, FIG. 1 shows about a half part of the entire circuit device 1 in a right-and-left direction in the figure. The circuit device 1 actually includes the other half part (on the right side of the illustrated half part) provided with components substantially symmetrical to those shown in FIG. 1. FIG. 2 shows only a little part of the circuit device 1 in plan view. Practically, a plurality of the boards 10 each including a substantially identical structure or symmetrical structure are arranged continuously lengthwise and breadthwise, which are bonded to a single heat radiation board 23 (omitted from FIG. 2).

Figure 3:
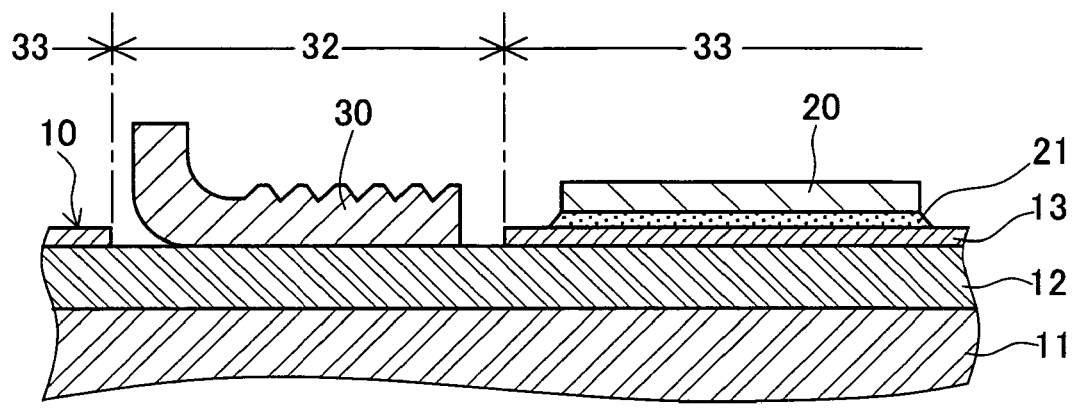
FIG. 3 is an enlarged sectional view of part of the circuit device.

FIG. 3 is an enlarged view of a part of the circuit device 1 shown in FIG. 1. As shown in FIGS. 2 and 3, the Ni layer 13 is not plated on and around a portion of the board 10 bonded with the end portion 30a of the bus bar 30. Specifically, an exposing region 32 in which Al of the wiring layer 12 is exposed is provided around the end portion 30a. The end portion 30a is directly bonded to the Al of the wiring layer 12 within the exposing region 32. The wiring layer 12 other than the exposing region 32 is coated with the Ni layer 13. In other words, the board 10 in the present embodiment is provided with the exposing region 32 in which Al of the wiring layer 12 is exposed and a coated region 33 in which Al of the wiring layer 12 is coated with the Ni layer 13.

Aluminum is apt to be oxidized when exposed, forming an oxide film, so that the bonding by solder 21 is rather difficult. On the other hand, the ultrasonic bonding of the bus bar 30 to the wiring layer 12 with the Ni layer 13 has a problem with the bonding property as mentioned above. To avoid such problems, the circuit device 1 in the present embodiment is arranged such that a portion of the wiring layer 12 to which the semiconductor device 20 is bonded by the solder 21 is coated with the Ni layer 13, whereas remaining portion to which the bus bar 30 is bonded by the ultrasonic bonding is uncoated with the Ni layer 13.

Figure 4:
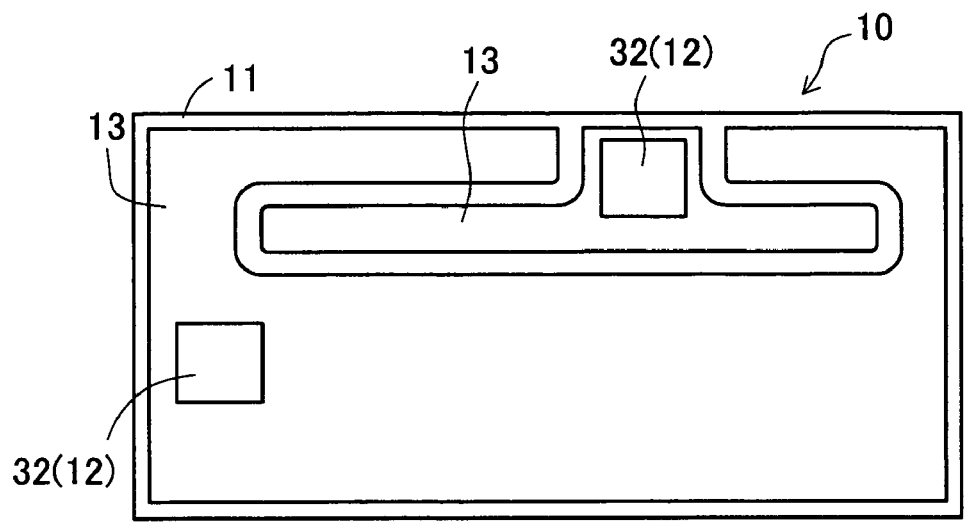
FIG. 4 is an explanatory view showing a ceramic board used in the circuit device.

FIG. 4 shows an example of the board 10 used in the present embodiment. On the surface of the ceramic substrate 11 is formed the Al wiring layer 12, whose shape is determined according to each configuration of the components to be bonded thereto. The Ni layer 13 is partially formed on the wiring layer 12, excepting the exposing region 32 corresponding to the place where the end portion 30a of the bus bar 30 is bonded. This exposing region 32 covers a range in which at least the end portion 30a contacts with the Al wiring layer 12 and a range which does not interfere with a place where the semiconductor device 20 is bonded by solder 21. This exposing region 32 is preferably determined to have an appropriate margin in consideration of variations or tolerances of the contact area of the end portion 30a. In this exposing region 32, the Al wiring layer 12 constructing an under layer thereof is visible.

Next, the manufacturing method of the circuit device 1 in the present embodiment will be explained below. This manufacturing method includes a wiring layer forming process, a partially plating process, a device bonding process, and an ultrasonic bonding process, which are executed in this order. Firstly, the wiring layer forming process is a process for forming the wiring layer 12 of Al onto the ceramic substrate 11. This process is the same as a conventional process.

The partially plating process is a process for applying partial Ni plating onto the wiring layer 12. In this partially plating method, for example, Ni plating is applied after providing a mask on only the area corresponding to the exposing region 32, that is, the contact area of the end portion 30a and the surrounding region around it. In this manner, the exposing region 32 remains uncoated with Ni. Alternatively, another way may be adopted, in which Ni plating is applied to all over the wiring layer 12, a mask is added to an area excepting the exposing region 32, that is, to the coating region 33, and then the plated layer of an unmasked area is removed by etching or the like. In this manner, the Ni layer plated to the exposing region 32 is removed by etching. In either case, the mask is removed after all operations of this process stage. Thus, the board 10 shown in FIG. 4 is completely formed.

The subsequent device bonding process is a process for soldering each semiconductor device 20 onto the board 10 at each predetermined place. In the place where each semiconductor device 20 is to be soldered, the Ni layer 13 has been formed as above. Since Ni is a metal having good solder wetability, the semiconductor device 20 can easily be soldered onto the Ni layer 13 with sufficient bonding strength. This process is the same as a conventional process.

Figure 5:
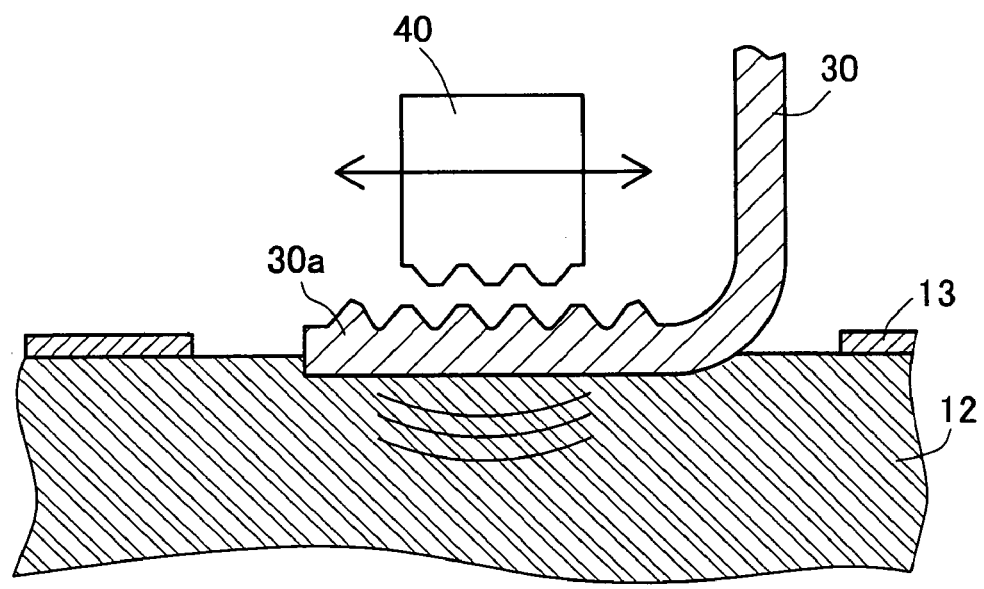
FIG. 5 is an explanatory view showing a bonding method in the present embodiment.
Figure 6:
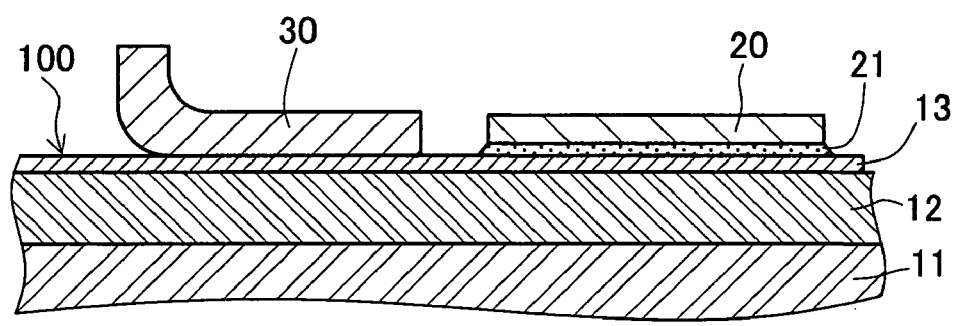
FIG. 6 is an explanatory view showing a conventional bonding method.
Figure 7:
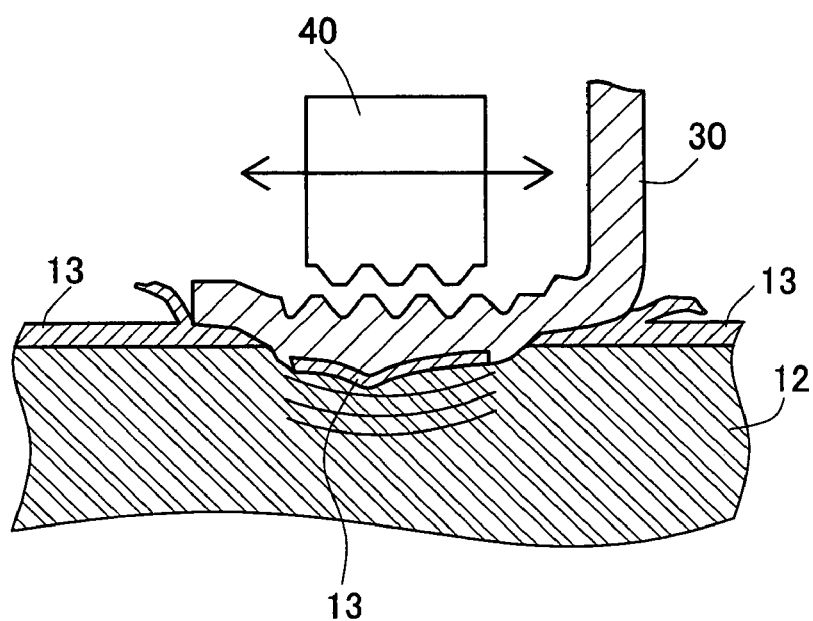
FIG. 7 is an explanatory view showing a bonded state by the conventional bonding method.

The ultrasonic bonding process is a process for ultrasonically bonding the bus bar 30 to the wiring layer 12. The end portion 30a of the bus bar 30 is placed on the substrate 10 at a predetermined place, and an ultrasonic horn 40 is set in contact with the end portion 30a from above. At this time, the lower surface in the figure of the end portion 30a is held in direct contact with the Al layer forming the wiring layer 12. When the ultrasonic horn 40 is actuated to vibrate, its vibrational energy is appropriately transmitted to the end portion 30a and, through this end portion 30a, to the wiring layer 12. As shown in FIG. 5, the end portion 30a can adequately be bonded to the wiring layer 12 with strong bonding strength because an oxide film resulting from oxidation of aluminum will cause no trouble in the ultrasonic bonding method.

Furthermore, there is no possibility of affecting the solder 21, 22 and the wiring layer 12, since the ultrasonic bonding method needs no heating. The other end of the bus bar 30, i.e., the end other than the bonded end portion with the wiring layer 12, is often connected directly to a housing containing the circuit device 1. Thus, vibration of the housing or stress thereto will be transmitted to the externally leading conductor. Such vibration or stress is likely to be transmitted directly to the bonded place without mitigation because the bus bar 30 generally has high rigidity. In general, the ultrasonic bonding provides higher bonding strength than the solder bonding. According to the present embodiment, therefore, the bus bar 30 can be bonded so securely as to stand against the vibration or stress transmitted thereto.

According to the manufacturing method in the present embodiment, as described above, the circuit device 1 in which both of the semiconductor devices 20 and bus bars 30 are appropriately bonded can be fabricated. In the explanation of the present embodiment, the semiconductor devices 20 and the bus bars 30 are bonded in the order that the device bonding process is performed before the ultrasonic bonding process. Alternatively, these processes may be performed in reverse order from above.

Results for evaluation test executed by the inventors of the present invention are shown below. Herein, the test was made to bond the bus bar 30 having the end portion 30a whose contact area with the Al layer was about 11 $mm^2$. The bonding conditions of the ultrasonic bonding were a frequency of 21 kHz, an amplitude of 44 μm, a pressing force of 160N, and a time of 1.2 seconds. The bonded part of the end portion 30a bonded in this bonding test was peeled away from the Al layer and the area of the actually bonded part was checked. It was found that almost all the contact area of the end portion 30a was bonded to the Al layer and hence that the area of the bonded part was enough to provide sufficient bonding strength. In a multipoint test, even a lowest result was superior to a best result obtained in a test using the above mentioned conventional technique. Further, the required level of bonding quality was fully achieved.

According to the circuit device 1 of the present invention, as explained above in detail, the Ni layer 13 is plated on the surface of the board 10 having the Al wiring layer 12, excepting the exposing region 32 to which the bus bar is to be bonded. Accordingly, each semiconductor device 20 can easily be bonded, with solder 21, to the coated region 33 in which the Ni layer 13 is formed. On the other hand, it is easy to ultrasonically bond the bus bar 30 to the exposing region 32 exposing the Al wiring layer 12. It is further possible to obtain a sufficient bonded area and bonding strength. Consequently, the circuit device 1 can be arranged so that the semiconductor devices 20 and the bus bars 30 are bonded respectively with sufficient bonding strength to the board 10 made of ceramics as a major component.

The present invention may be embodied in other specific forms without departing from the spirit or essential characteristics thereof. For instance, each shape of the board 10, wiring layer 12, bus bar 30, and others shown in the present embodiment is merely one example and not limited thereto. Al, Ni, and Cu may not be pure. While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A circuit device in which a functional device and an externally leading conductor are mounted, comprising:
   a substrate;
   a wiring layer provided on the substrate and electrically connected to the functional device and to the externally leading conductor; and
   a coating metal layer formed on a part of the wiring layer to provide a coated region in which the wiring layer is coated and an exposing region in which the wiring layer is exposed;
   wherein the functional device is connected onto the coating metal layer within the coated region through solder, and the externally leading conductor is bonded directly to a part of the wiring layer within the exposing region.

2. The circuit device according to claim 1, wherein the wiring layer is made of aluminum.

3. The circuit device according to claim 2, wherein the coating metal layer is made of metal having solder wetability superior to aluminum.

4. The circuit device according to claim 3, wherein the coating metal layer is made of nickel or copper.

5. The circuit device according to claim 1, wherein the externally leading conductor is bonded to the wiring layer within the exposing region by ultrasonic bonding.

6. A method of manufacturing a circuit device in which a functional device and an externally leading conductor are mounted, the method comprising the steps of:
   partially forming a coating metal layer onto a wiring layer formed on a substrate, thereby providing a coated region in which the wiring layer is coated and an exposing region in which the wiring layer is exposed;
   connecting the functional device onto the coating metal layer within the coated region through solder; and
   bonding the externally leading conductor directly to a portion of the wiring layer within the exposing region.

7. The manufacturing method of the circuit device, according to claim 6, wherein the wiring layer is made of aluminum.

8. The manufacturing method of the circuit device, according to claim 7, wherein the coating metal layer is made of metal having solder wetability superior to aluminum.

9. The manufacturing method of the circuit device, according to claim 8, the coating metal layer is made of nickel or copper.

10. The manufacturing method of the circuit device, according to claim 6, wherein the externally leading conductor is bonded onto the wiring layer within the exposing region by ultrasonic bonding.

* * * * *